(12) United States Patent
Liao et al.

(10) Patent No.: US 7,312,518 B2
(45) Date of Patent: Dec. 25, 2007

(54) MINIATURIZED MULTI-CHIP MODULE AND METHOD FOR MANUFACTURING THE SAME

(75) Inventors: Kuo-Hsien Liao, Taichung (TW); Jia-Yang Chen, Taichung (TW); Chuei-Tang Wang, Taichung (TW)

(73) Assignee: Universal Scientific Industrial Co., Ltd. (TW)

( * ) Notice: Subject to any disclaimer, the term of this patent is extended or adjusted under 35 U.S.C. 154(b) by 356 days.

(21) Appl. No.: 11/206,843

(22) Filed: Aug. 19, 2005

(65) Prior Publication Data

US 2006/0249838 A1 Nov. 9, 2006

(30) Foreign Application Priority Data

May 5, 2005 (TW) ................................ 94114516 A

(51) Int. Cl.
*H01L 23/02* (2006.01)

(52) U.S. Cl. ...................... 257/686; 257/777; 438/109

(58) Field of Classification Search ................ 257/686, 257/777, 723, 724, 778, 698; 438/107, 108, 438/109, 110, 125

See application file for complete search history.

(56) References Cited

U.S. PATENT DOCUMENTS

| | | | | |
|---|---|---|---|---|
| 6,737,742 | B2 * | 5/2004 | Sweterlitsch | 257/723 |
| 7,034,387 | B2 * | 4/2006 | Karnezos | 257/686 |
| 7,180,165 | B2 * | 2/2007 | Ellsberry et al. | 257/686 |
| 7,217,994 | B2 * | 5/2007 | Zhu et al. | 257/686 |
| 7,247,932 | B1 * | 7/2007 | Lin et al. | 257/686 |

\* cited by examiner

*Primary Examiner*—S. V. Clark
(74) *Attorney, Agent, or Firm*—Banner & Witcoff, Ltd.

(57) ABSTRACT

A miniaturized multi-chip module suitable for application to wireless transmission devices includes a substrate, integrated circuit chips mounted on and connected electrically to the substrate, and an interposer mounted on one surface of the substrate. The interposer cooperates with the substrate to confine a receiving space for receiving the integrated circuit chips on the surface of the substrate to which the interposer is attached, and is provided with conductors that are connected electrically to the substrate. Therefore, when the interposer is mounted on a circuit board, the conductors serve as external electrical connections for the integrated circuit chips. A method for manufacturing the miniaturized multi-chip module is also disclosed.

18 Claims, 12 Drawing Sheets

MINIATURIZED MULTI-CHIP MODULE AND METHOD FOR MANUFACTURING THE SAME

CROSS-REFERENCE TO RELATED APPLICATION

This application claims priority of Taiwanese application no. 094114516, filed on May 5, 2005.

BACKGROUND OF THE INVENTION

1. Field of the Invention

The invention relates to a multi-chip module, more particularly to a miniaturized multi-chip module suitable for application to wireless transmission devices and to a method for manufacturing the same.

2. Description of the Related Art

FIG. 1 illustrates a conventional multi-chip module 20 for application to a wireless transmission device (not shown). The multi-chip module 20 includes a plurality of integrated circuit chips 21, a module substrate 22, and a plurality of solder balls 23.

One of the integrated circuit chips 21 has a wireless transmission capability.

The module substrate 22 has a first surface 221, a second surface 222 opposite to the first surface 221, a plurality of first solder pads 223 formed on the first and second surfaces 221, 222, and a plurality of second solder pads 224 formed on the first surface 221 and connected electrically to the first solder pads 223.

In general, the solder balls 23 are planted onto the second solder pads 224 using a ball-planting machine (not shown), and configure the multi-chip module 20 into a ball grid array (BGA) package. The solder balls 23 serve as external electrical connections for the integrated circuit chips 21 when the multi-chip module 20 is mounted on a circuit board (not shown) of a target device (not shown) so as to provide the latter with a wireless transmission capability.

FIGS. 2A to 2E illustrate consecutives steps of a method for manufacturing the conventional multi-chip module 20 of FIG. 1. The manufacturing method includes the following steps:

a) Referring to FIG. 2A, the module substrate 22 is formed. The module substrate 22 has first and second surfaces 221, 222, the first solder pads 223 formed on the first and second surfaces 221, 222, and the second solder pads 224 formed on the first surface 221. The electrical connections between the first and second solder pads 223, 224 are not illustrated for the sake of brevity.

b) Referring to FIG. 2B, a first one of the integrated circuit chips 21 is mounted fixedly on the second surface 222 of the module substrate 22 at corresponding ones of the first solder pads 223 through conventional solder techniques.

c) Referring to FIG. 2C, the module substrate 22 is turned such that the first surface 221 thereof faces upwardly and, referring to FIG. 2D, second and third ones of the integrated circuit chips 21 are mounted fixedly on the first surface 221 of the module substrate 22 at corresponding ones of the first solder pads 223 through conventional solder techniques.

d) Finally, referring to FIG. 2E, the solder balls 23 are planted onto the second solder pads 224, respectively, to complete the multi-chip module 20.

As shown in FIG. 2F, the solder balls 23 are to be registered with and to be connected to corresponding solder pads 11 on a circuit board 10 of a target device (not shown). When mounted, the multi-chip module 20 provides the target device with a wireless transmission capability.

The following are some of the drawbacks attributed to the use of the solder balls 23 in the conventional multi-chip module 20:

1. Referring again to FIG. 1, it is assumed that the integrated circuit chips 21 on the first surface 221 of the module substrate 22 have a maximum height of 0.4 mm. Therefore, the diameter of each of the solder balls 23 should be larger than 0.4 mm. In practice, the diameter of the solder balls 23 is chosen to be at least 0.5 mm. In addition, there should be a gap of at least 0.4 mm between adjacent ones of the solder balls 23 to avoid occurrence of short circuiting between the adjacent solder balls 23. Under these conditions, if the size of the module substrate 22 is 10×10 mm, and if solder balls 23 are not to be provided at four corners of the first surface 221 of the module substrate 22, each side of the first surface 221 of the module substrate 22 can accommodate a maximum of nine solder balls 23. In other words, since the module substrate 22 can only accommodate a total of thirty-six solder balls 23, the number of available external electrical connections for the integrated circuit chips 21 cannot exceed thirty-six. In view of the ever-increasing complexity and growing functionality of the integrated circuit chips 21, the required number of external electrical connections for the chips 21 could eventually exceed thirty-six, which necessitates the use of a larger module substrate 22. However, a larger module substrate 22 goes against the trend toward miniaturization of electronic devices.

2. As shown in FIG. 2F, when the conventional multi-chip module 20 is mounted on the circuit board 10 of the target device, the solder balls 23 are subjected to thermal and compression stresses that can result in non-uniform deformation of the solder balls 23 and in the possibility of short-circuiting between adjacent ones of the solder balls 23.

3. The ball-planting machine for planting the solder balls 23 is an expensive piece of equipment. Purchasing the ball-planting machine results in higher capital costs for manufacturers of the conventional multi-chip module 20. While the ball-planting operation could be contracted to other manufacturers, this would entail a longer production cycle.

SUMMARY OF THE INVENTION

Therefore, the main object of the present invention is to provide a miniaturized multi-chip module suitable for application to wireless transmission devices and capable of overcoming at least one of the aforementioned drawbacks of the prior art.

Another object of the present invention is to provide a method for manufacturing the miniaturized multi-chip module of this invention.

According to one aspect of the invention, there is provided a miniaturized multi-chip module adapted to be mounted on a circuit board so as to establish electrical connection therewith. The miniaturized multi-chip module comprises a substrate, a plurality of integrated circuit chips, and an interposer.

The substrate has a first surface, a second surface opposite to the first surface, a plurality of first solder pads formed on the second surface, and a plurality of second solder pads formed on the second surface and connected electrically to the first solder pads.

At least one of the integrated circuit chips is mounted on the second surface of the substrate at corresponding ones of the first solder pads, and has a largest height measured from the second surface of the substrate.

The interposer has a thickness not less than the largest height of said at least one of the integrated circuit chips on the second surface of the substrate. The interposer includes a substrate-confronting surface, a board-confronting surface opposite to the substrate-confronting surface, a surrounding wall surface interconnecting the substrate-confronting surface and the board-confronting surface, and a plurality of conductors that extend between the substrate-confronting surface and the board-confronting surface.

The substrate-confronting surface is mounted on the second surface of the substrate such that the conductors are connected electrically and respectively to the second solder pads, and such that the surrounding wall surface cooperates with the second surface of the substrate to form a receiving space that receives said at least one of the integrated circuit chips on the second surface of the substrate therein.

The thickness of the interposer enables mounting of the board-confronting surface on the circuit board such that the conductors are connected electrically to the circuit board without interference from said at least one of the integrated circuit chips on the second surface of the substrate.

According to another aspect of the invention, a method for manufacturing a miniaturized multi-chip module comprises:

a) forming a substrate that has a first surface, a second surface opposite to the first surface, a plurality of first solder pads formed on the second surface, and a plurality of second solder pads formed on the second surface and connected electrically to the first solder pads;

b) mounting an integrated circuit chip on the second surface of the substrate at corresponding ones of the first solder pads, the integrated circuit chip having a largest height measured from the second surface of the substrate;

c) forming an interposer having a thickness not less than the largest height of the integrated circuit chip on the second surface of the substrate, the interposer including a substrate-confronting surface, a board-confronting surface opposite to the substrate-confronting surface, a surrounding wall surface interconnecting the substrate-confronting surface and the board-confronting surface, and a plurality of conductors that extend between the substrate-confronting surface and the board-confronting surface; and d) mounting the substrate-confronting surface of the interposer on the second surface of the substrate such that the conductors are connected electrically and respectively to the second solder pads, and such that the surrounding wall surface cooperates with the second surface of the substrate to form a receiving space that receives the integrated circuit chip on the second surface of the substrate therein.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
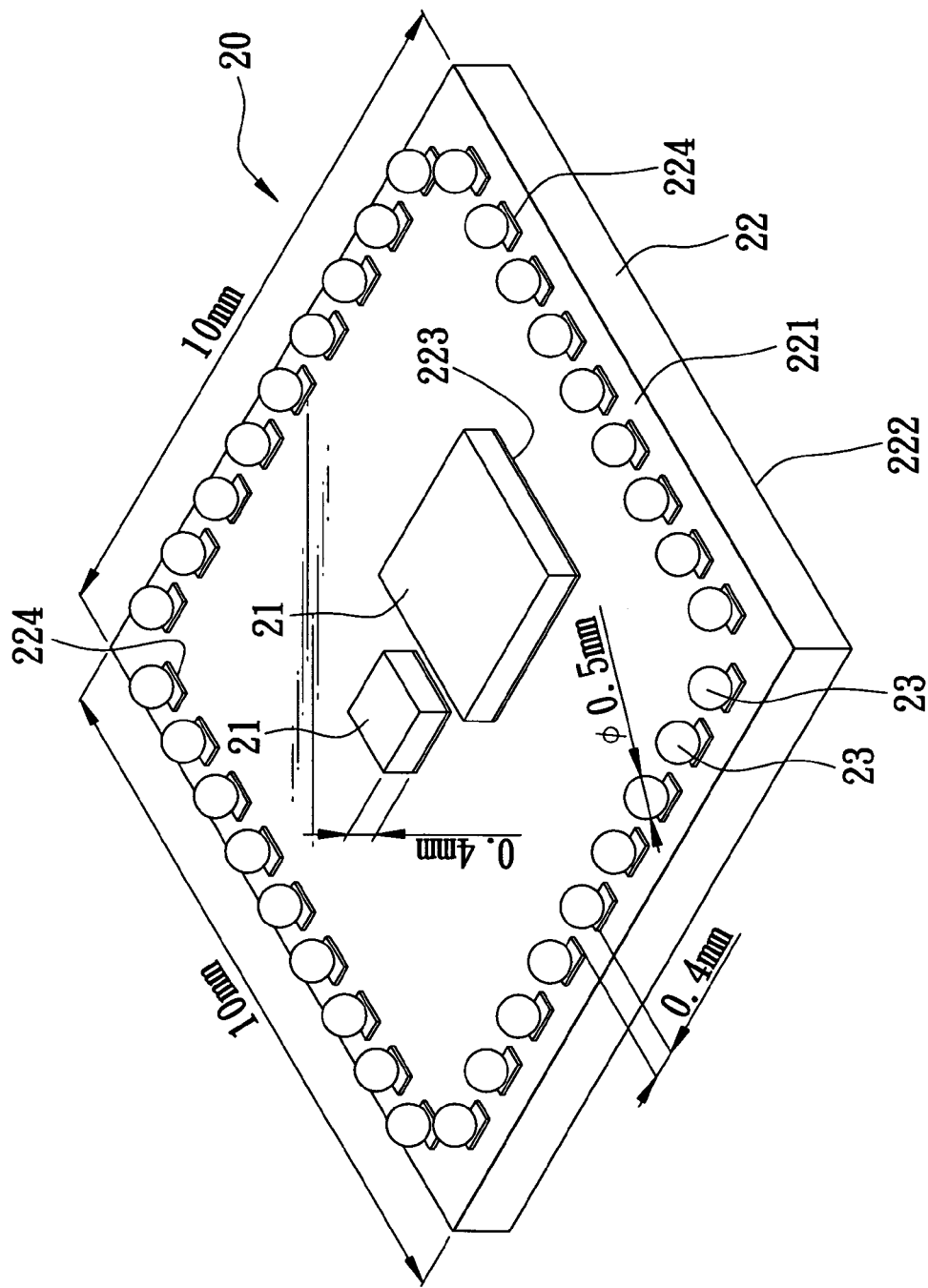
FIG. 1 is a perspective view of a conventional multi-chip module in the form of a ball-grid array (BGA) package.
Figure 2A:
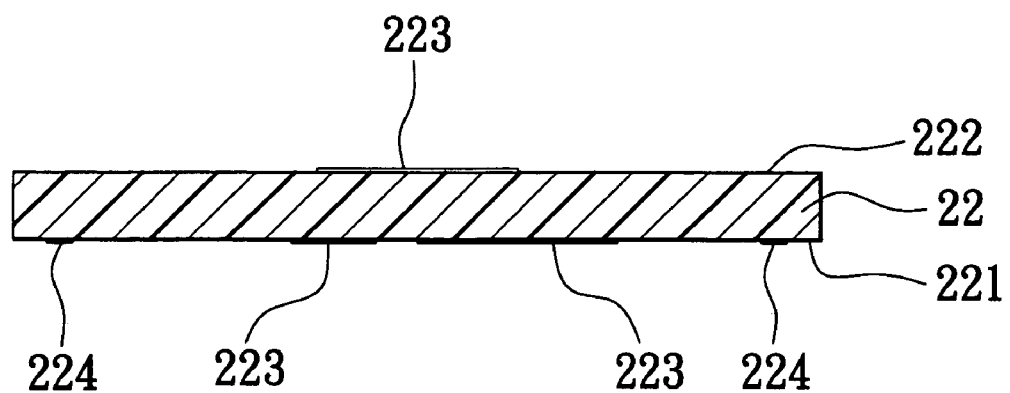
FIGS. 2A to 2E illustrate consecutive steps of a method for manufacturing the conventional multi-chip module of FIG. 1.
Figure 2B:
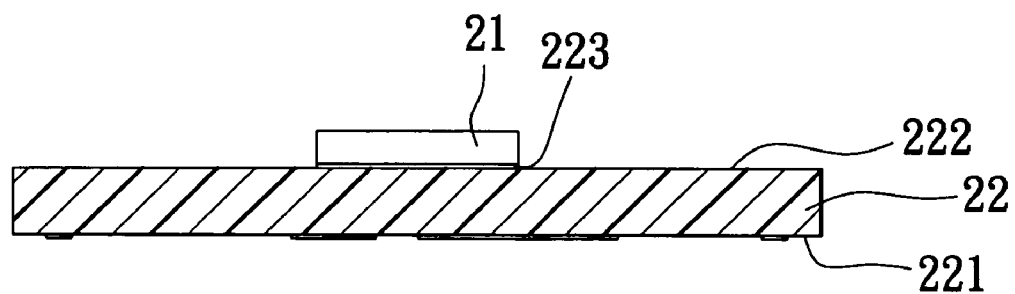
Figure 2C:
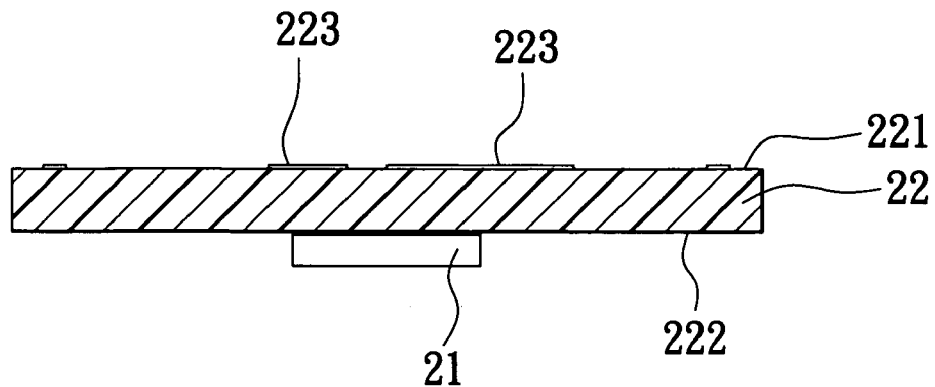
Figure 2D:
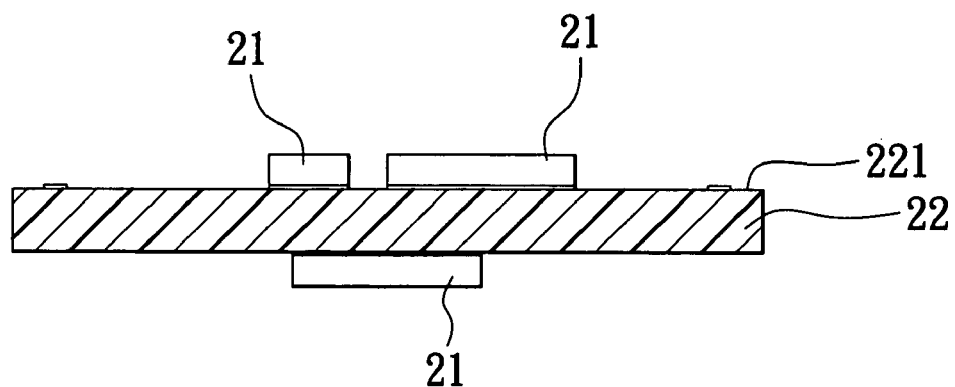
Figure 2E:
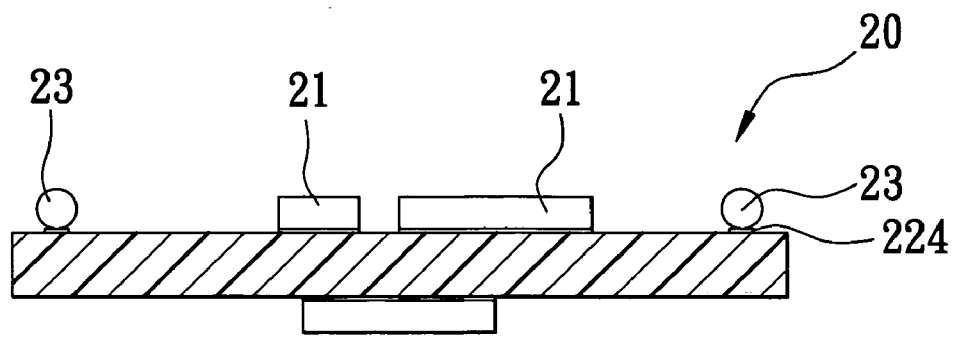
Figure 2F:
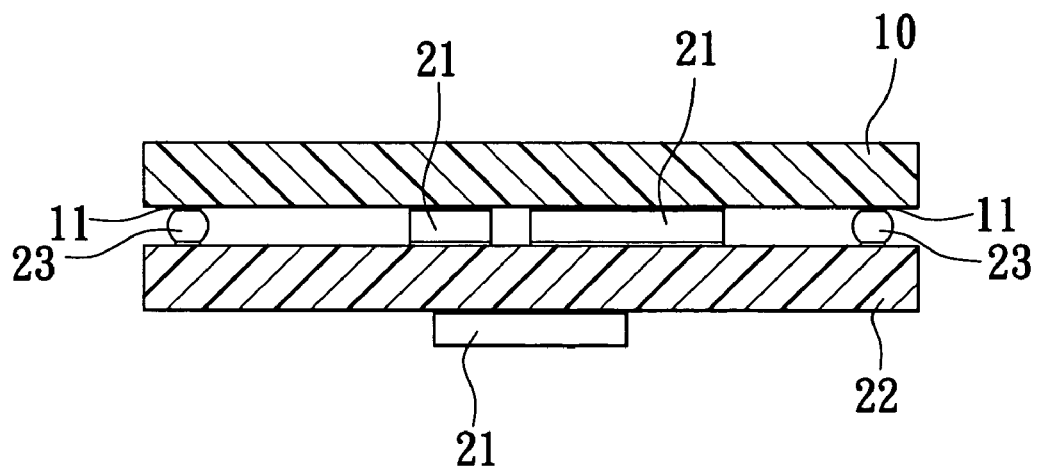
FIG. 2F illustrates the conventional multi-chip module when mounted on a circuit board of a target device.

Before the present invention is described in greater detail, it should be noted that like elements are denoted by the same reference numerals throughout the disclosure.

Figure 3:
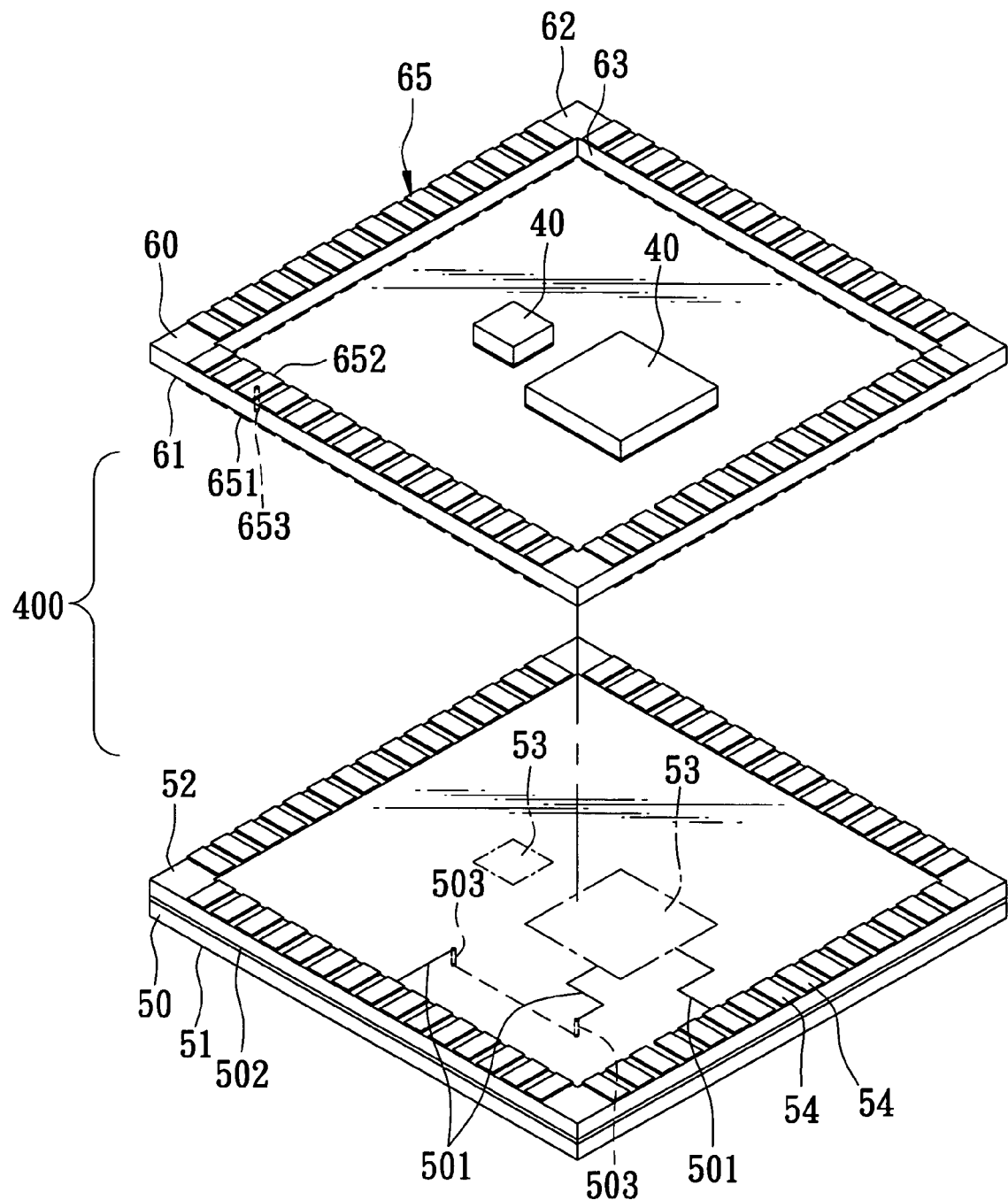
FIG. 3 is an exploded perspective view of the first preferred embodiment of a miniaturized multi-chip module according to the present invention.
Figure 4:
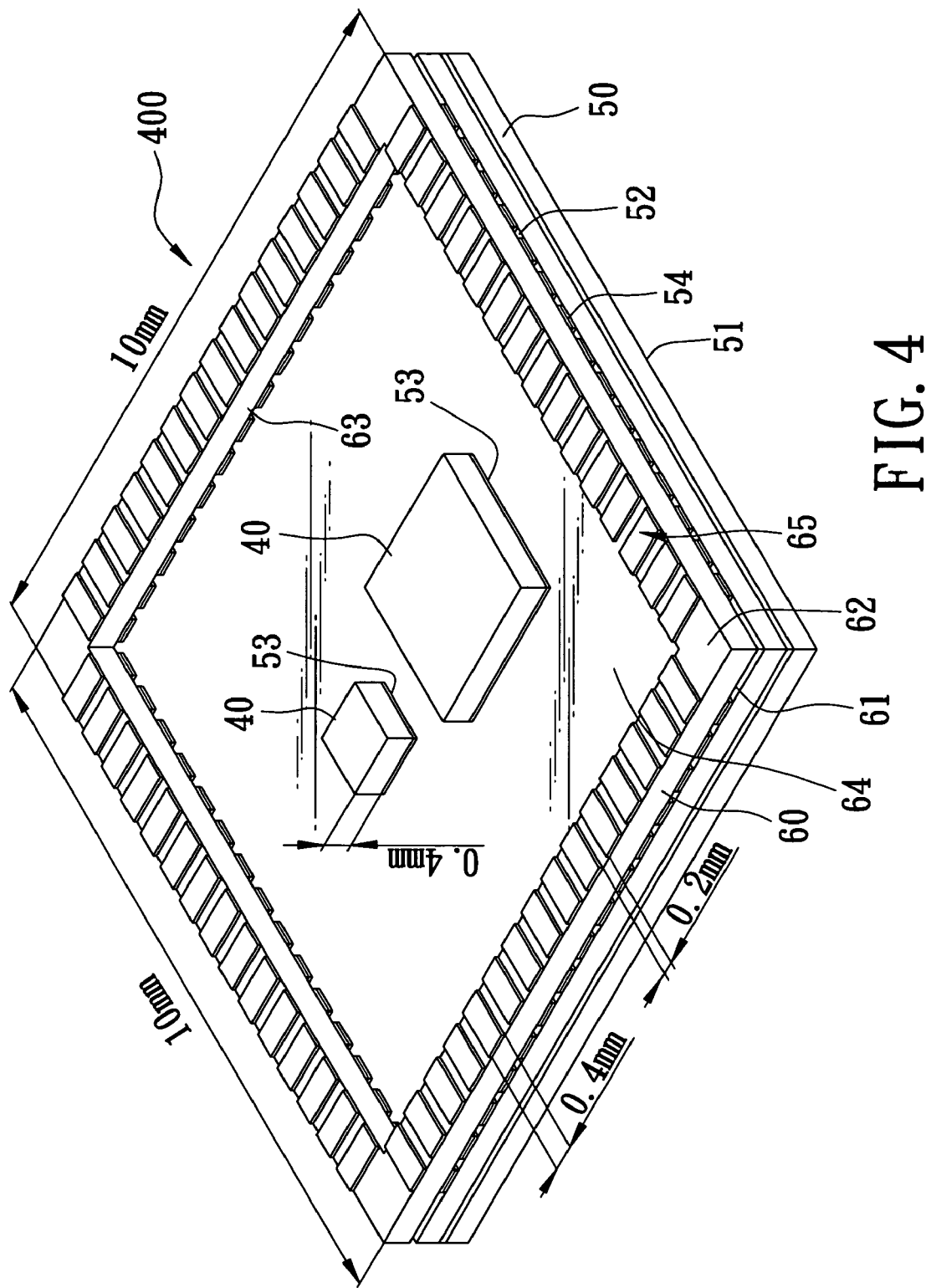
FIG. 4 is an assembled perspective view of the first preferred embodiment.

Referring to FIGS. 3 and 4, the first preferred embodiment of a miniaturized multi-chip module 400 according to the present invention is adapted for mounting on a circuit board 30 (see FIG. 6F) of a target device so as to establish electrical connection therewith. In this embodiment, the miniaturized multi-chip module 400 provides the target device with a wireless transmission capability when mounted on the circuit board 30, and includes a substrate 50, a plurality of integrated circuit chips 40 (there are three integrated circuit chips 40 in this embodiment, as best shown in FIGS. 6E and 6F), and an interposer 60.

One of the integrated circuit chips 40 is a commercially available chip having a wireless transmission capability, such as a WLAN chip, Bluetooth chip, WiMAX chip, UWB chip, DTV receiver chip and GPS receiver chip.

In this embodiment, the substrate 50 has a first surface 51, a second surface 52 opposite to the first surface 51, a plurality of first solder pads 53 formed on the first and second surfaces 51, 52, and a plurality of second solder pads 54 formed on the second surface 52 and connected electrically to the first solder pads 53.

In this embodiment, the substrate 50 is formed from a printed circuit board, such as a paper-based copper foil laminate, a composite copper foil laminate, and a polymer-impregnated glass-fiber-based copper foil laminate.

In addition, the second solder pads 54 are arranged on a periphery of the substrate 50 and are disposed to surround the first solder pads 53. As best shown in FIG. 3, depending on the complexity of the external electrical connections required by the integrated circuit chips 40, the electrical connection between corresponding ones of the first and second solder pads 53, 54 could be achieved in a conventional manner using a combination of circuit traces 501 formed on the first and second surfaces 51, 52 of the substrate 50, an intermediate wiring layer 502 of the substrate 50, and conductive holes 503 (e.g., plated holes or conductor-filled holes) that interconnect the circuit traces 501 to the wiring layer 502. It is noted that the electrical connections between the first and second solder pads 53, 54 are not illustrated in FIG. 4 for the sake of brevity.

In this embodiment, the integrated circuit chips 40 are mounted on the first and second surfaces 51, 52 of the substrate 50 at corresponding ones of the first solder pads 53. It is noted that the integrated circuit chips 40 on the second surface 52 of the substrate 50 have a largest height, such as 0.4 mm, measured from the second surface 52.

The interposer 60 has a thickness not less than the largest height of the integrated circuit chips 40 on the second surface 52 of the substrate 50. The interposer 60 includes a substrate-confronting surface 61, a board-confronting surface 62 opposite to the substrate-confronting surface 61, a surrounding wall surface 63 interconnecting the substrate-confronting surface 61 and the board-confronting surface 62, and a plurality of conductors 65 that extend between the substrate-confronting surface 61 and the board-confronting surface 62.

The substrate-confronting surface 61 is mounted on the second surface 52 of the substrate 50 such that the conductors 65 are connected electrically and respectively to the second solder pads 54, and such that the surrounding wall surface 63 cooperates with the second surface 52 of the substrate 50 to form a receiving space 64 that receives the integrated circuit chips 40 on the second surface 52 of the substrate 50 therein.

The thickness of the interposer 60 enables mounting of the board-confronting surface 62 on the circuit board 30 (see FIG. 6F) of the target device such that the conductors 65 are connected electrically to corresponding solder pads 31 on the circuit board 30 without interference from the integrated circuit chips 40 on the second surface 52 of the substrate 50.

In this embodiment, the interposer 60 is in the form of a loop, and the surrounding wall surface 63 surrounds the receiving space 64.

In this embodiment, the interposer 60 is likewise formed from a printed circuit board, such as a paper-based copper foil laminate, a composite copper foil laminate, and a polymer-impregnated glass-fiber-based copper foil laminate.

Moreover, in this embodiment, the conductors 65 are land grid array (LGA) interconnect conductors, each having two solder pad parts 651, 652 disposed respectively on the substrate-confronting and board-confronting surfaces 61, 62, and a conductive hole 653 (e.g., plated hole or conductor-filled hole) interconnecting the solder pad parts 651, 652.

Figure 5:
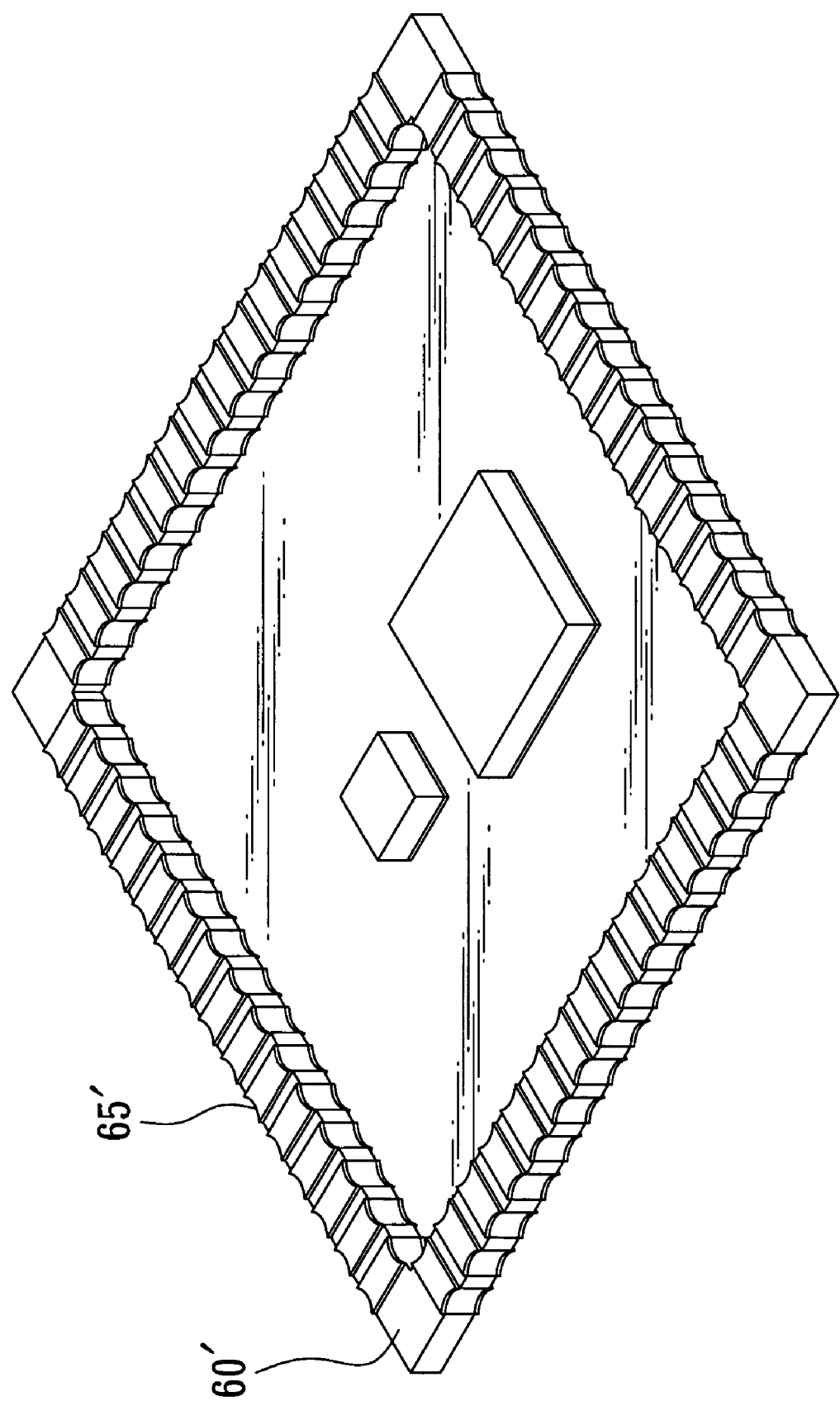
FIG. 5 illustrates a modified interposer of the first preferred embodiment.

FIG. 5 illustrates a modified interposer 60' for the miniaturized multi-chip module of the first preferred embodiment. Unlike the interposer 60 of FIGS. 3 and 4, the conductors 65' of the interposer 60' are conventional castellated interconnect conductors.

It is noted herein that both LGA interconnect conductors and castellated interconnect conductors are suitable for making electrical connections using surface mount technology (SMT).

Figure 6A:
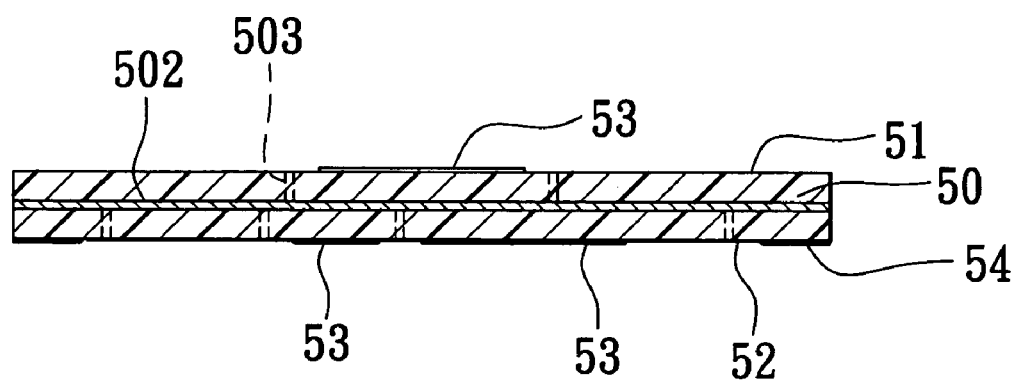
FIGS. 6A to 6E illustrate consecutive steps of a method for manufacturing the miniaturized multi-chip module of the first preferred embodiment.
Figure 6B:
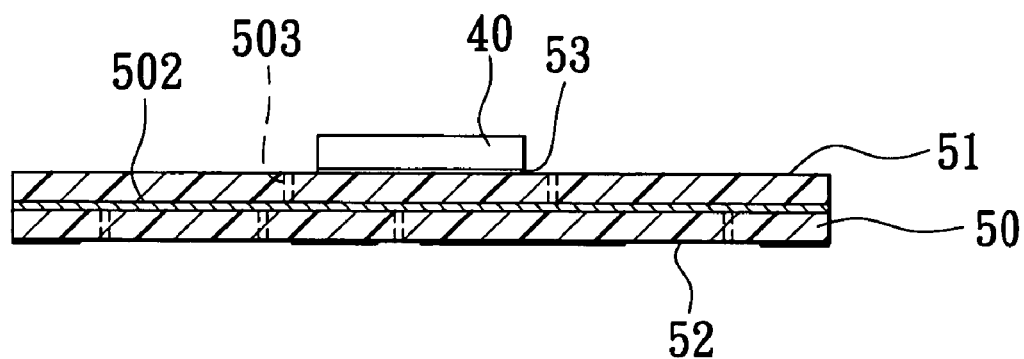
Figure 6C:
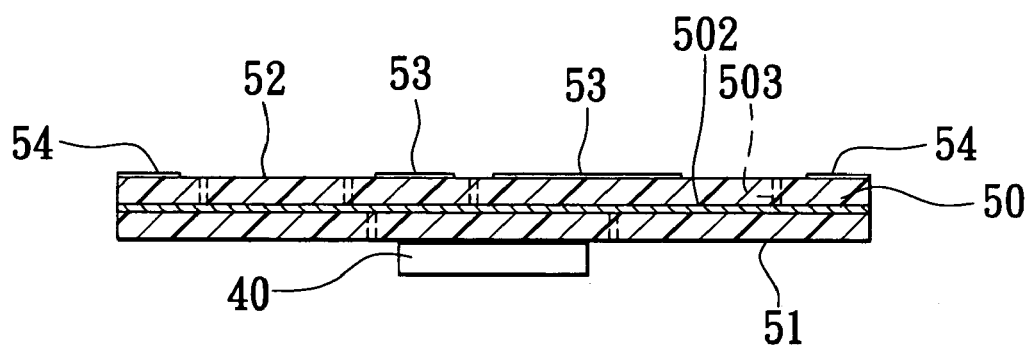
Figure 6D:
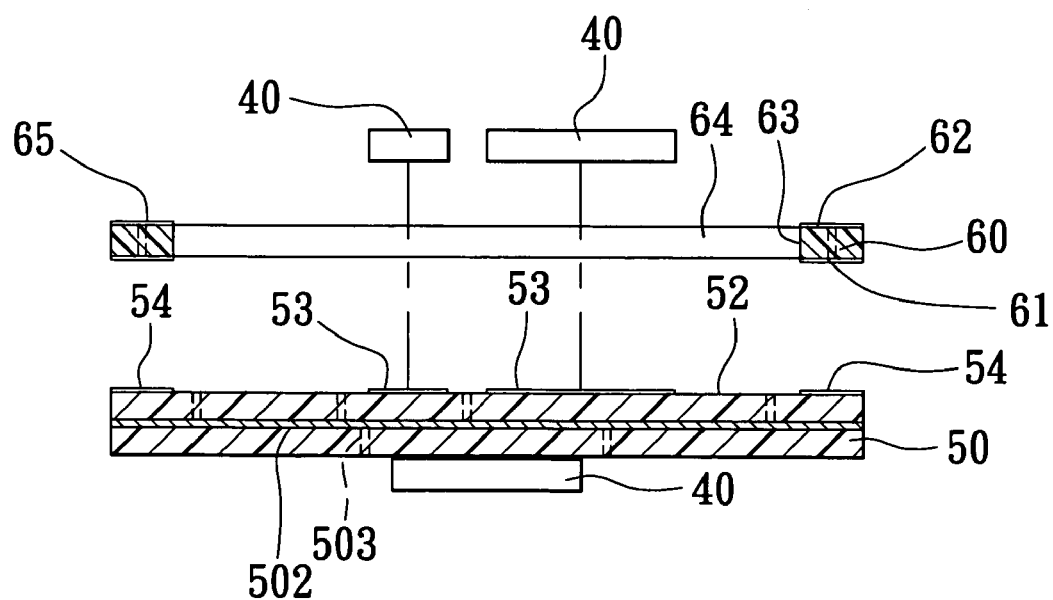
Figure 6E:
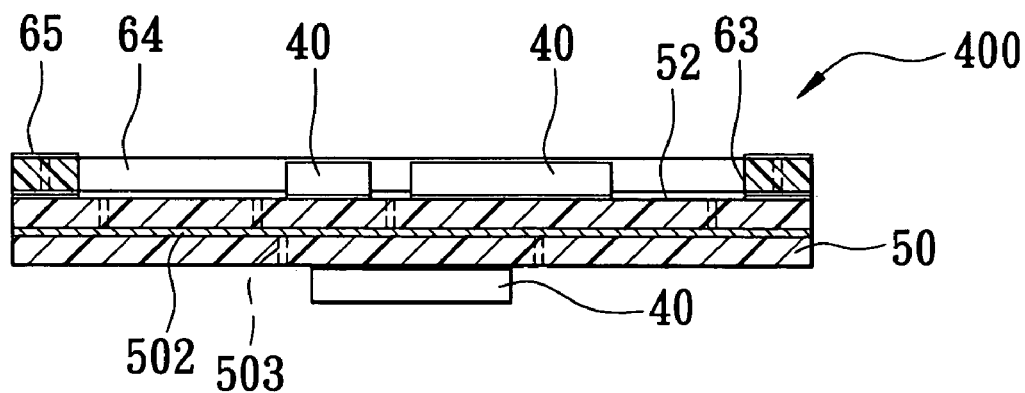
Figure 6F:
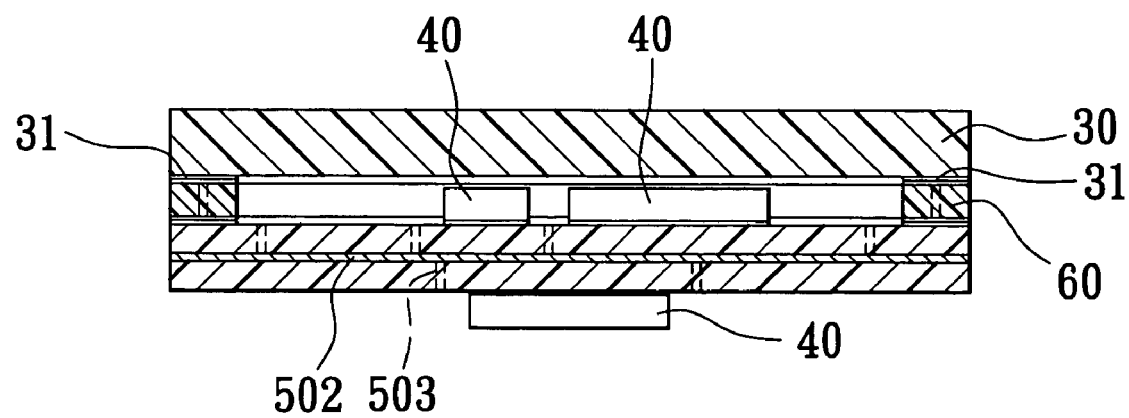
FIG. 6F illustrates the miniaturized multi-chip module of the first preferred embodiment when mounted on a circuit board of a target device.

FIGS. 6A to 6E illustrate consecutive steps of a method for manufacturing the miniaturized multi-chip module 400 of the first preferred embodiment. The method comprises the following steps:

a) Referring to FIG. 6A, the substrate 50 is formed. The substrate 50 has first and second surfaces 51, 52, the first solder pads 53 formed on the first and second surfaces 51, 52, and the second solder pads 54 formed on the second surface 52 and connected electrically to the first solder pads 53.

b) Referring to FIG. 6B, a first one of the integrated circuit chips 40 is mounted on the first surface 51 of the substrate 50 at corresponding ones of the first solder pads 53 through conventional solder techniques.

c) Referring to FIG. 6C, the substrate 50 is turned such that the second surface 52 thereof faces upwardly.

d) Referring to FIG. 6D, second and third ones of the integrated circuit chips 40 are mounted on the second surface 52 of the substrate 50 at corresponding ones of the first solder pads 53 through conventional solder techniques.

e) Referring to FIG. 6D, the interposer 60 is formed. The interposer 60, which has a thickness not less than the largest height of the integrated circuit chips 40 on the second surface 52 of the substrate 50, includes the substrate-confronting surface 61, the board-confronting surface 62, the surrounding wall surface 63, and the conductors 65.

f) Finally, referring to FIG. 6E, the substrate-confronting surface 61 of the interposer 60 is mounted on the second surface 52 of the substrate 50 such that the conductors 65 are connected electrically and respectively to the second solder pads 54, and such that the surrounding wall surface 63 cooperates with the second surface 52 of the substrate 50 to form the receiving space 64 that receives the integrated circuit chips 40 on the second surface 52 of the substrate 50 therein, thereby completing the miniaturized multi-chip module 400.

As shown in FIG. 6F, the conductors 65 are to be registered with and to be bonded to corresponding solder pads 31 on the circuit board 30 of the target device (not shown). When mounted, the miniaturized multi-chip module 400 provides the target device with a wireless transmission capability.

Referring once again to FIG. 4, it is assumed that the size of the substrate 50 is 10×10 mm, and that the widths of the second solder pads 54 and the conductors 65 are 0.4 mm. Adjacent second solder pads 54 and adjacent conductors 65 have a gap of 0.2 mm therebetween. Under the condition that the second solder pads 54 and the conductors 65 are not to be provided at four corners of the substrate 50 and the interposer 60, each side of the substrate 50 and the interposer 60 can accommodate a maximum of fifteen second solder pads 54 or conductors 65. In other words, since the substrate 50 and the interposer 60 can accommodate a total of sixty second solder pads 54 or conductors 65, the number of available external electrical connections for the integrated circuit chips 40 is increased to sixty without incurring a corresponding increase in the size of the multi-chip module 400. In practice, if the required number of external electrical connections for the integrated circuit chips 40 is only thirty-six, it is possible to reduce the sizes of the substrate 50 and the interposer 60 accordingly.

In the present invention, the widths of the second solder pads 54 and the conductors 65 are not limited by the heights of the integrated circuit chips 40 on the substrate 50. As a result, the widths of the second solder pads 54 and the conductors 65 can be chosen to be much smaller than the heights of the integrated circuit chips 40 so as to result in a higher circuit layout density. The thickness of the interposer 60 is chosen to be not less than the largest height of the integrated circuit chips 40 on the second surface 52 of the substrate 50 such that the integrated circuit chips 40 do not interfere with mounting of the miniaturized multi-chip module 400 of this invention on the circuit board 30 of the target device. Further, the interposer 60 is not likely to experience non-uniform deformation due to thermal and compression stresses when the miniaturized multi-chip module 400 of this invention is mounted on the circuit board 30 of the target device. Moreover, since mounting of the miniaturized multi-chip module 400 of this invention on the circuit board 30 of the target device can be conducted using SMT, an expensive ball-planting machine is not required in the manufacture of the miniaturized multi-chip module 400 of this invention.

Figure 7:
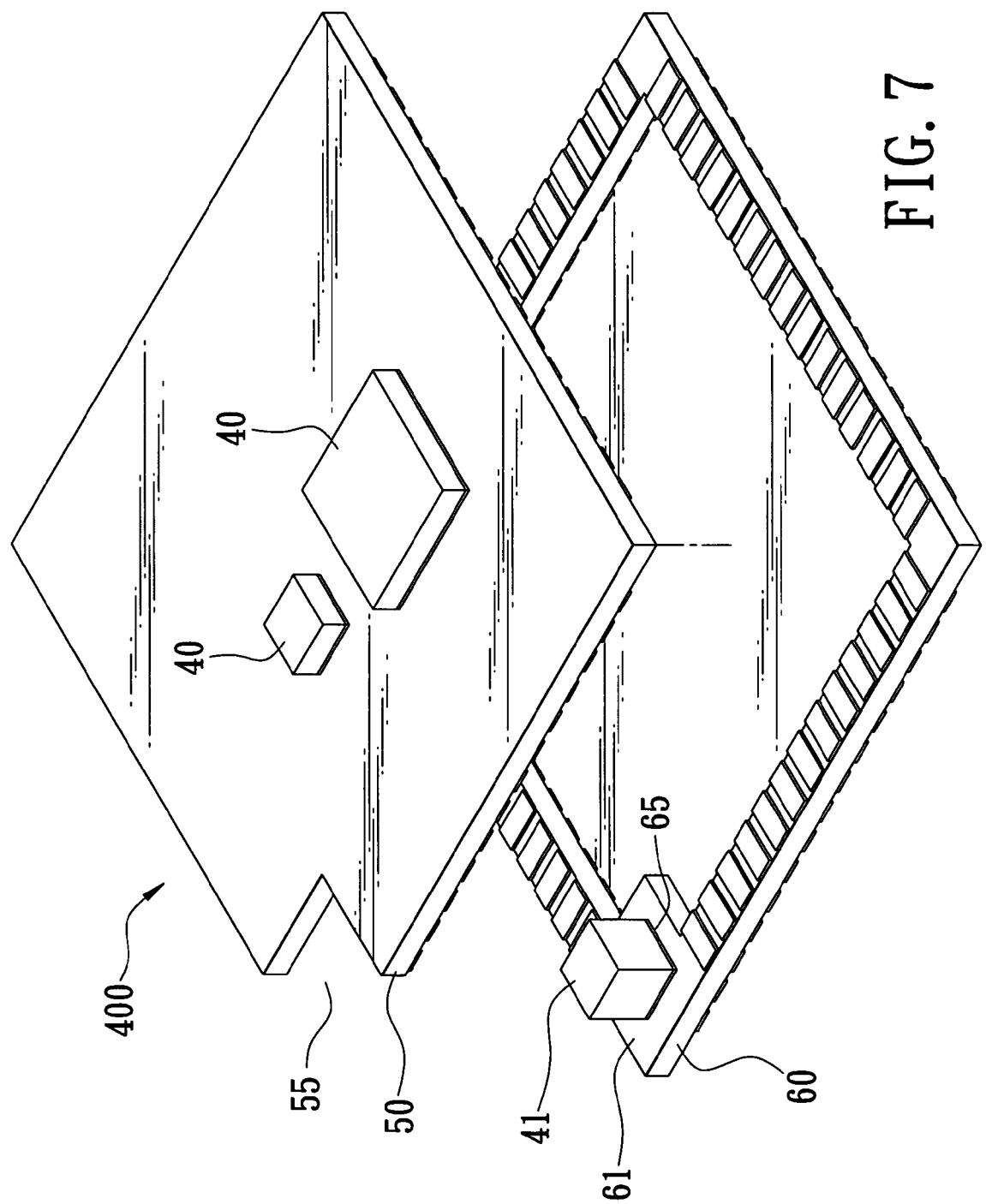
FIG. 7 is an exploded perspective view of the second preferred embodiment of a miniaturized multi-chip module according to the present invention.
Figure 8:
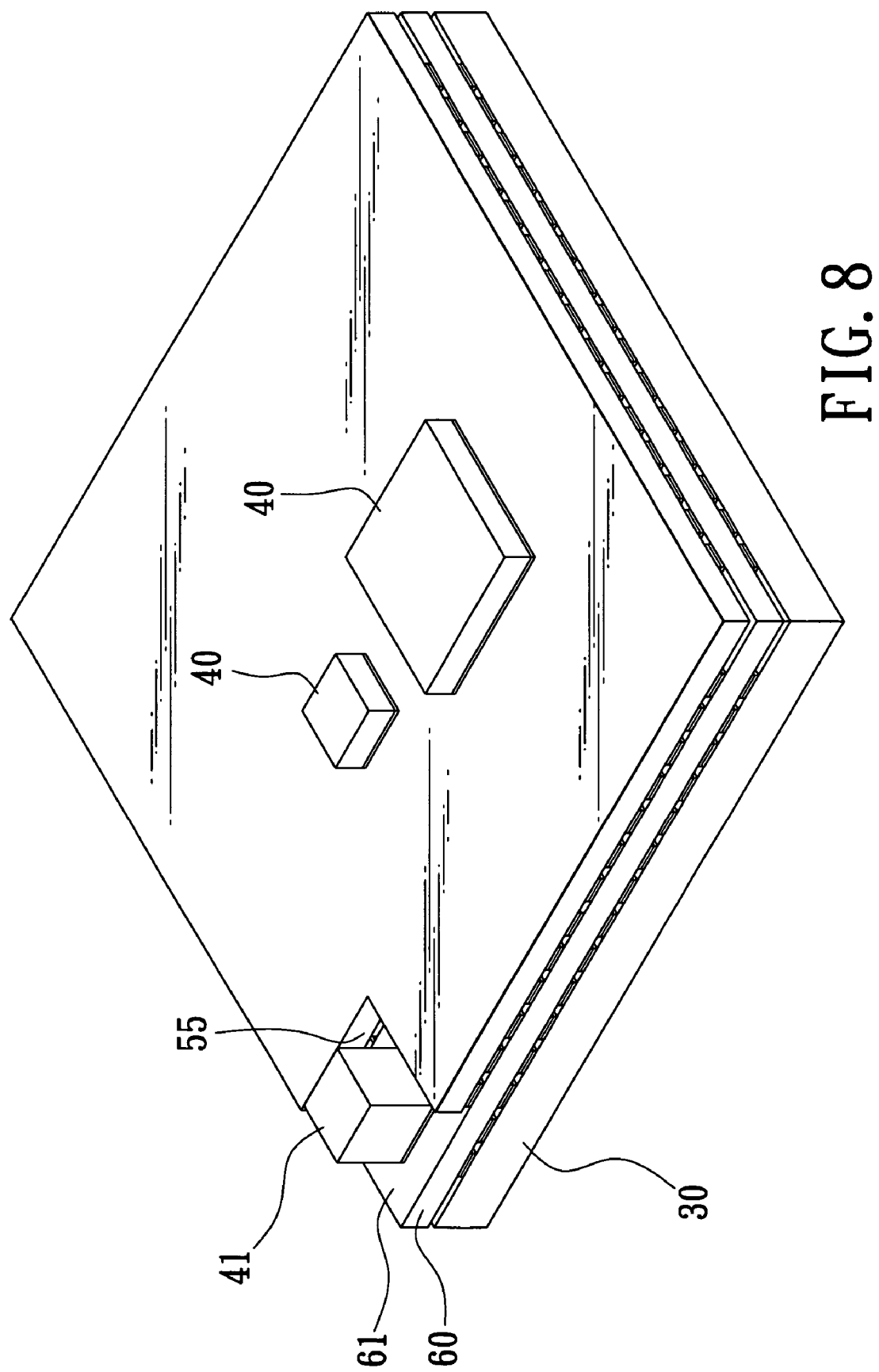
FIG. 8 is an assembled perspective view of the second preferred embodiment when mounted on a circuit board of a target device.

FIGS. 7 and 8 illustrate the second preferred embodiment of a miniaturized multi-chip module 400 according to the present invention. Unlike the previous embodiment, an additional integrated circuit chip 41 is mounted on the substrate-confronting surface 61 of the interposer 60 and is connected electrically to corresponding ones of the conductors 65. The substrate 50 is formed with a notch 55 to accommodate the additional integrated circuit chip 41 mounted on the interposer 60. The additional integrated circuit chip 41 has a largest height compared to the other integrated circuit chips 40 mounted on the substrate 50. By providing the integrated circuit chip 41 with the largest height on the interposer 60 instead of on the substrate 50, the overall thickness of the miniaturized multi-chip module 400 of this embodiment can be reduced.

In view of the presence of the interposer 60 in the miniaturized multi-chip module 400 of this invention, the aforesaid drawbacks associated with the conventional multi-chip modules in the form of BGA packages can be overcome.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A miniaturized multi-chip module adapted to be mounted on a circuit board so as to establish electrical connection therewith, said miniaturized multi-chip module comprising:
    a substrate having a first surface, a second surface opposite to said first surface, a plurality of first solder pads formed on said second surface, and a plurality of second solder pads formed on said second surface and connected electrically to said first solder pads;
    a plurality of integrated circuit chips, at least one of which is mounted on said second surface of said substrate at corresponding ones of said first solder pads, said at least one of said integrated circuit chips having a largest height measured from said second surface of said substrate; and
    an interposer having a thickness not less than the largest height of said at least one of said integrated circuit chips on said second surface of said substrate, said interposer including a substrate-confronting surface, a board-confronting surface opposite to said substrate-confronting surface, a surrounding wall surface interconnecting said substrate-confronting surface and said board-confronting surface, and a plurality of conductors that extend between said substrate-confronting surface and said board-confronting surface,
        said substrate-confronting surface being mounted on said second surface of said substrate such that said conductors are connected electrically and respectively to said second solder pads, and such that said surrounding wall surface cooperates with said second surface of said substrate to form a receiving space that receives said at least one of said integrated circuit chips on said second surface of said substrate therein,
        said board-confronting surface being adapted for mounting on the circuit board such that said conductors are connected electrically to the circuit board.

2. The miniaturized multi-chip module as claimed in claim 1, wherein said interposer is in the form of a loop, and said surrounding wall surface surrounds said receiving space.

3. The miniaturized multi-chip module as claimed in claim 1, wherein said conductors are land grid array (LGA) interconnect conductors.

4. The miniaturized multi-chip module as claimed in claim 1, wherein said conductors are castellated interconnect conductors.

5. The miniaturized multi-chip module as claimed in claim 1, wherein said first solder pads are further formed on said first surface of said substrate, another one of said integrated circuit chips being mounted on said first surface of said substrate at corresponding ones of said first solder pads.

6. The miniaturized multi-chip module as claimed in claim 1, wherein another one of said integrated circuit chips is mounted on said substrate-confronting surface of said interposer and is connected electrically to corresponding ones of said conductors, said substrate being formed with a notch to accommodate said another one of said integrated circuit chips mounted on said interposer.

7. The miniaturized multi-chip module as claimed in claim 1, wherein one of said integrated circuit chips has a wireless transmission capability.

8. The miniaturized multi-chip module as claimed in claim 7, wherein said one of said integrated circuit chips having a wireless transmission capability is one of a WLAN chip, Bluetooth chip, WiMAX chip, UWB chip, DTV receiver chip and GPS receiver chip.

9. The miniaturized multi-chip module as claimed in claim 1, wherein each of said substrate and said interposer is formed from a printed circuit board.

10. The miniaturized multi-chip module as claimed in claim 9, wherein said printed circuit board from which each of said substrate and said interposer is formed is independently selected from the group consisting of a paper-based copper foil laminate, a composite copper foil laminate, and a polymer-impregnated glass-fiber-based copper foil laminate.

11. A method for manufacturing a miniaturized multi-chip module, comprising:
    a) forming a substrate that has a first surface, a second surface opposite to the first surface, a plurality of first solder pads formed on the second surface, and a plurality of second solder pads formed on the second surface and connected electrically to the first solder pads;
    b) mounting an integrated circuit chip on the second surface of the substrate at corresponding ones of the first solder pads, the integrated circuit chip having a largest height measured from the second surface of the substrate;
    c) forming an interposer having a thickness not less than the largest height of the integrated circuit chip on the second surface of the substrate, the interposer including a substrate-confronting surface, a board-confronting surface opposite to the substrate-confronting surface, a surrounding wall surface interconnecting the substrate-confronting surface and the board-confronting surface, and a plurality of conductors that extend between the substrate-confronting surface and the board-confronting surface; and
    d) mounting the substrate-confronting surface of the interposer on the second surface of the substrate such that the conductors are connected electrically and respectively to the second solder pads, and such that the surrounding wall surface cooperates with the second surface of the substrate to form a receiving space that receives the integrated circuit chip on the second surface of the substrate therein.

12. The method as claimed in claim 11, wherein, in step c), the interposer is formed into a loop such that the surrounding wall surface surrounds the receiving space in step d).

13. The method as claimed in claim 11, wherein, in step c), the conductors of the interposer are land grid array (LGA) interconnect conductors.

14. The method as claimed in claim 13, wherein, in step c), the conductors of the interposer are castellated interconnect conductors.

15. The method as claimed in claim 11, wherein:
   in step a), the first solder pads are further formed on the first surface of the substrate,
   the method further comprising mounting another integrated circuit chip on the first surface of the substrate at corresponding ones of the first solder pads.

16. The method as claimed in claim 11, wherein:
   in step a), the substrate is formed with a notch,
   the method further comprising mounting another integrated circuit chip on the substrate-confronting surface of the interposer such that said another integrated circuit chip is connected electrically to corresponding ones of the conductors and is accommodated in the notch in the substrate.

17. The method as claimed in claim 11, wherein each of the substrate and the interposer is formed from a printed circuit board.

18. The method as claimed in claim 17, wherein the printed circuit board from which each of the substrate and the interposer is formed is independently selected from the group consisting of a paper-based copper foil laminate, a composite copper foil laminate, and a polymer-impregnated glass-fiber-based copper foil laminate.

* * * * *